(12) United States Patent
Deckers et al.

(10) Patent No.: US 10,964,850 B2
(45) Date of Patent: Mar. 30, 2021

(54) LIGHTING DEVICE

(71) Applicant: Lumileds LLC, San Jose, CA (US)

(72) Inventors: Michael Deckers, Aachen (DE); Benno Spinger, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/850,623

(22) Filed: Apr. 16, 2020

(65) Prior Publication Data
US 2020/0335667 A1  Oct. 22, 2020

(30) Foreign Application Priority Data

Apr. 18, 2019 (EP) .................................... 19170176

(51) Int. Cl.
*H01L 33/46* (2010.01)
*H01L 33/50* (2010.01)
*F21S 41/153* (2018.01)
*H01L 25/075* (2006.01)
*F21S 41/24* (2018.01)

(52) U.S. Cl.
CPC .......... *H01L 33/465* (2013.01); *F21S 41/153* (2018.01); *F21S 41/24* (2018.01); *H01L 25/0753* (2013.01); *H01L 33/505* (2013.01)

(58) Field of Classification Search
CPC ................................. F21S 41/24; F21S 41/153
USPC ......................................................... 362/545
See application file for complete search history.

(56) References Cited

U.S. PATENT DOCUMENTS

| 5,436,809 A * | 7/1995 | Brassier .................. B60Q 1/26 362/545 |
| 6,520,666 B1 * | 2/2003 | Beyerlein ............... F21V 13/02 362/471 |
| 7,391,582 B2 * | 6/2008 | Inui ....................... G11B 7/0935 356/446 |
| 8,469,563 B2 * | 6/2013 | Hwang .................. B60R 1/1207 340/475 |
| 9,631,794 B2 * | 4/2017 | Kamee .................... F21V 13/08 |
| 10,243,122 B2 * | 3/2019 | Ito .......................... H01L 33/507 |
| 10,267,470 B2 * | 4/2019 | Wada ..................... F21S 41/141 |
| 10,658,558 B2 * | 5/2020 | Moran ................... H01L 33/644 |
| 2008/0298059 A1 * | 12/2008 | Schug ...................... H01L 33/58 362/240 |
| 2009/0003400 A1 * | 1/2009 | Nagahama ............ H01L 33/483 372/50.23 |
| 2010/0264438 A1 | 10/2010 | Suenaga |
| 2011/0025190 A1 | 2/2011 | Jagt |
| 2016/0079486 A1 | 3/2016 | Sugimoto et al. |

(Continued)

FOREIGN PATENT DOCUMENTS

GB          2492542 A     1/2013
WO    2017036900 A1    3/2017

*Primary Examiner* — Bryon T Gyllstrom
(74) *Attorney, Agent, or Firm* — Volpe Koenig

(57) ABSTRACT

A lighting device is provided comprising at least one light-emitting element comprising a light-emitting surface configured to emit light; and a light-guiding sheet at least partially covering the light-emitting surface and comprising at least one cavity forming a passage for light emitted from the light-emitting surface. Thereby, at least one lateral surface limiting the at least one cavity is configured to reflect light emitted from the light-emitting surface. Further, a size of an opening of the at least one cavity facing the light-emitting surface is smaller than an area of the light-emitting surface.

17 Claims, 5 Drawing Sheets

(56) References Cited

U.S. PATENT DOCUMENTS

| | | | |
|---|---|---|---|
| 2016/0172550 A1* | 6/2016 | Suto | H01L 33/60 |
| | | | 257/89 |
| 2016/0268488 A1 | 9/2016 | Goeoetz et al. | |
| 2016/0351620 A1* | 12/2016 | Tanaka | H01L 33/50 |
| 2017/0365746 A1 | 12/2017 | Vampola et al. | |
| 2018/0166424 A1* | 6/2018 | Sim | H01L 33/483 |

* cited by examiner

LIGHTING DEVICE

CROSS REFERENCE TO RELATED APPLICATIONS

This application claims the benefit of European Patent Application No. 19170176.2 filed on Apr. 18, 2019, the contents of which are hereby incorporated by reference herein.

FIELD OF THE INVENTION

The present disclosure relates to a lighting device, in particular to be used in the area of automotive exterior lighting, and to a method of producing the lighting device.

BACKGROUND OF THE INVENTION

Lighting devices comprising one or more light-emitting elements such as light-emitting diodes (LEDs) may form light sources e.g. in automotive front lighting. When including arrangements of plural light-emitting elements, e.g. matrix arrangements of light-emitting diodes (LEDs), such lighting devices may allow for dynamic adaption of beam shape and emitted intensity to driving or lighting conditions. To this end, individual light-emitting elements or groups of light-emitting elements of such matrix arrangement may be independently addressable. Such lighting devices are suitable e.g. for the automotive field of adaptive driving beams (ADB).

Lighting devices may be provided with optical components for optical adjustment of emitted light. For example, collimating optics may compensate for diverging light and may concentrate light intensity along desired directions. In case of plural light-emitting elements, a reduction of mutual spacing between the light-emitting elements may reduce a required size of optical components and may allow for more compact system designs. However, in particular light-emitting elements such as LEDs may often have spatially broad (e.g. Lambertian) emission characteristics which are more difficult to be compensated for when using smaller collimating optics.

SUMMARY OF THE INVENTION

One or more embodiments of the disclosure provide a lighting device comprising at least one light-emitting element, in particular at least one light-emitting diode (LED), with enhanced light emission efficiency, in particular to be used for Adaptive Driving Beam (ADB) applications. One or more embodiments provide a lighting device that allows for a close mutual arrangement of multiple light-emitting elements such as LEDs. Other embodiments relate to a method for producing a lighting device and to a use of a lighting device.

According to a first aspect of the present invention, a lighting device is provided comprising: at least one light-emitting element comprising a light-emitting surface configured to emit light; and a light-guiding sheet at least partially covering the light-emitting surface and comprising at least one cavity forming a passage for light emitted from the light-emitting surface. Thereby, at least one lateral surface limiting the at least one cavity is configured to reflect light emitted from the light-emitting surface and a size of an opening of the at least one cavity facing the light-emitting surface is smaller than an area of the light-emitting surface.

According to a second aspect of the present disclosure, a method for producing a lighting device is provided, the method comprising: providing at least one light-emitting element comprising a light-emitting surface configured to emit light; providing a light-guiding sheet to at least partially cover the light-emitting surface; forming at least one cavity in the light-guiding sheet to provide a passage for light emitted from the light-emitting surface, at least one lateral surface of the light-guiding sheet limiting the at least one cavity being configured to reflect light emitted from the light-emitting surface. Thereby, the step of forming the at least one cavity comprises forming the at least one cavity with a size of an opening of the at least one cavity facing the light-emitting surface to be smaller than an area of the light-emitting surface.

According to a third aspect of the present disclosure, a use of a lighting device according to the first aspect for automotive lighting is provided, in particular for automotive head lighting.

Exemplary embodiments of the first, second and third aspect of the disclosure may have one or more of the properties described below.

According to an exemplary embodiment of the disclosure, the at least one light-emitting element is a light-emitting diode (LED), in particular at least one LED arranged on a printed circuit board (PCB). For example, the LED may be an LED formed using a Wafer Level Packaging (WLP) technology. In exemplary embodiments, a light-emitting element may be an LED die. In exemplary embodiments, a size of a light-emitting surface of the light-emitting element, e.g. of an LED die, is in between 0.5 mm$^2$ to 1 mm$^2$. Thereby, the light-emitting surface may for example essentially correspond to a top surface of a light emitting device such as an LED die, or may correspond to at least a portion of such top surface. Further, in exemplary embodiments, the lighting device may comprise a plurality of LEDs, e.g. LED dies, forming a matrix arrangement where each individual LED or individual groups of LEDs may be individually addressable. To this end, the plurality of LEDs may be mounted on a printed circuit board for connection with corresponding control electronics. Such LED matrix arrangement may be used for example in Adaptive Driving Beam modules for automotive front lighting (ADB LED matrix arrangement).

In an alternative exemplary embodiment, the lighting device may comprise a plurality of LEDs (e.g. LED dies) forming a micro LED array suitable to be used in a display. For example, individual LEDs may be configured to be used as individual pixel elements in a flat panel display, a smartphone or smartwatch display.

In yet a further alternative embodiment, the lighting device may comprise a single LED (e.g. LED die) or a plurality of LEDs (e.g. LED dies) for single beam applications.

The at least one light-emitting element has a light-emitting surface configured to emit light. In exemplary embodiments, the light-emitting surface may be a light-exit surface through which light generated by the light-emitting element is emitted from the light-emitting element. Said light-emitting surface may in exemplary embodiments correspond to a surface of the light-emitting element facing away from a substrate onto which the light-emitting element is mounted. As mentioned, the light-emitting surface may for example essentially correspond to at least part of a top surface of a light emitting device such as an LED die. For example, the light-emitting element may have a substantially planar shape and may be arranged on a substrate, e.g. a printed circuit board (PCB), wherein a surface (e.g. a main face) of the light-emitting element or part thereof facing away from the substrate may be configured as light-emitting surface. More particularly, the light-emitting element may for example be a planar semiconductor element, e.g. a light-emitting diode (LED) die, arranged on a printed circuit board and controlled using control electronics via the printed circuit board. In accordance with certain embodiments, the light-emitting element may have a light-emitting surface comprising or consisting of (semi-transparent or transparent) a ceramic material, for example a material consisting of or comprising aluminum oxide.

According to an exemplary embodiment of the disclosure, the lighting device further comprises at least one wavelength conversion layer, in particular a layer comprising Phosphor, arranged at least on a portion of the light-emitting surface. For example, the wavelength conversion layer may comprise Phosphor and may be suitable for converting blue or ultraviolet light emitted from the light-emitting element at least partially into yellow light to be mixed with remaining blue or ultraviolet light for white light generation.

According to embodiments of the disclosure, the light-guiding sheet of the lighting device covers the light-emitting surface at least partially. In other words, in an exemplary embodiment, the light-guiding sheet is arranged at least partially on the light-emitting surface and at least a portion thereof covers (e.g. an edge portion of) the light-emitting surface and is in direct or in indirect contact therewith. For example, this portion may be in indirect contact with the light-emitting surface via a wavelength conversion layer.

In an exemplary embodiment, the light-guiding sheet forms a layer of the lighting device arranged on the light-emitting surface of the at least one light-emitting element. The light-guiding sheet may thus be an essentially planar element, in accordance with an exemplary embodiment without portions thereof being placed aside of the at least one light-emitting element, e.g. without portions arranged in between neighboring LED dies of an ADB LED matrix arrangement. The light-guiding sheet may thus allow for a close mutual spacing of plural light-emitting elements. In exemplary embodiments, the light-guiding sheet may comprise or consist of a glass, ceramic, silicone or metal, placed in direct or indirect contact with the at least one light-emitting surface of the light-emitting element.

According to embodiments of the disclosure, the light-guiding sheet has at least one cavity that forms a passage for light emitted from the light-emitting surface. For example, the cavity may form a hole through the light-guiding sheet with one opening thereof facing the at least one light-emitting element, and one opening thereof facing the opposite direction. More than one cavity may be arranged on a single light emitting element. In other words, in an exemplary embodiment, the light-guiding sheet comprises at least two cavities corresponding to the at least one light-emitting element forming respective passages for light emitted from the the light-emitting surface of the said at least one light-emitting element.

The light-guiding sheet may be arranged on the at least one light-emitting element such that the at least one cavity formed in the light-guiding sheet is arranged on the at least one light-emitting surface and thus allows light emitted from the light-emitting surface to be transmitted through the light-guiding sheet (i.e. forms a passage for this light). The cavity may be filled with air or a material at least partially transparent for light emitted from the at least one light-emitting element, e.g. a transparent or partially transparent Silicone.

In an exemplary embodiment of the disclosure, the at least one cavity may be formed by applying a laser treatment and/or an etching process. A laser treatment may for example comprise a laser cutting process for cutting the cavity into a material sheet of suitable material. An etching process may comprise etching the at least one cavity into a material sheet, e.g. using Hydrofluoric acid in case of a glass sheet. The at least one cavity or a plurality of cavities may be etched into the material sheet using a suitable mask. In particular, the at least one cavity may be formed by applying a combined treatment (a laser induced etching process), e.g. by applying a laser treatment to a portion of a material sheet, for example a sheet comprising or consisting of glass, a sheet comprising or consisting of ceramic, a sheet comprising or consisting of silicone or a sheet comprising or consisting of metal, and by applying a subsequent etching process to the treated portion. Such laser treatment may be controlled to locally change internal properties of the treated portion and to thus enable said treated portion to be at least partially removed by the subsequent etching process. In other words, the laser treatment may modify the treated portion to be more susceptible to a subsequent etching process. When applying the subsequent etching process, the laser treated sheet may for example be immersed in an aqueous solution of a suitable acid such as Hydrofluoric (HF) acid. The combination of laser treatment and subsequent etching process (laser induced etching) is suitable in particular for processing of thin glass sheets, in particular to glass sheets with a thickness smaller than 1 mm, more particularly to glass sheets with a thickness smaller than 0.75 mm. Such processing thus enables a use of thin light-guiding sheets, which in turn allows for a compact and robust construction of the lighting device. Thus, according to an exemplary embodiment of the second aspect of the disclosure, the step of forming the at least one cavity may include a step of applying a laser treatment to a portion of a material sheet, in particular comprising glass, ceramic, silicone or metal and a step of applying an etching process at least to the portion of the material sheet to form the at least one cavity.

Further according to embodiments of the disclosure, at least one lateral surface limiting the at least one cavity is configured to reflect light emitted from the light-emitting surface. For example, a cavity may comprise a circular or elliptical cross-section and may be limited by a continuous side-surface. In an alternative example, a cavity may comprise a square, rectangular or polygonal cross-section, in which cases the cavity may be limited by a corresponding plurality of side-surfaces. For example, a cavity with a rectangular cross-section may be limited by four side-surfaces. Light emitted from the light-emitting element towards the at least one lateral surface limiting the at least one cavity may at least partially be reflected in a direction towards a normal of the light-emitting surface. In other words, in exemplary embodiments, the at least one cavity forms a reflector cup configured to collimate light emitted from the light-emitting element. In order to enhance reflectivity of the at least one lateral surface limiting the at least one cavity, said lateral surface may in exemplary embodiments be provided with a reflective coating, e.g. with a silver, aluminum or a dichroitic atomic layer deposition (ALD) coating. In accordance with exemplary embodiments, the lateral surface may be provided with a specular reflective coating.

According to an exemplary embodiment of the disclosure, the at least one cavity comprises a diameter smaller than 1 mm, in particular in between 0.02 mm and 1 mm. For example, the at least one cavity may have a smallest diameter larger than 0.02 mm and a largest diameter smaller than 1 mm. Given such dimension, a cavity in accordance with this exemplary embodiment may be suitable to be used in connection e.g. with LED dies with a size of a light-emitting surface in between 0.5 mm$^2$ and 1.0 mm$^2$.

According to one or more embodiments of the disclosure, a size of an opening of the at least one cavity facing the light-emitting surface is smaller than an area of the light-emitting surface. This reduced-size opening thus reduces an effective light-emitting area of the light-emitting surface, from which light enters the cavity. By reducing the size of the light source emitting light into the cavity, a collimating effect of the cavity is enhanced. At the same time, use of the cavity opening itself for this purpose eliminates a need for a corresponding dedicated component.

According to an exemplary embodiment of the disclosure, the at least one cavity is tapered in a direction towards the at least one light-emitting element. In other words, an opening of the cavity on a side thereof facing away from the light-emitting surface may have a size larger than a size of the opening of the at least one cavity facing the light-emitting surface. Such larger opening at a light-exit side of the at least one cavity decreases a size of a bridge portion of the light-guiding sheet bridging adjacent cavities in a case in which two or more cavities are formed in the light-guiding sheet in correspondence with two or more light-emitting elements of a plural light-emitting element arrangement (e.g. a matrix LED arrangement or a micro LED array). In other words, a larger opening of the cavity at its light-exit side may help to reduce a pixel to pixel gap and may thus optically bridge gaps e.g. between adjacent LEDs in matrix or array arrangements of LEDs. In an exemplary embodiment of the disclosure, a thickness of the bridge portion bridging adjacent cavities is smaller than 0.5 mm, in particular smaller than 0.2 mm.

According to an exemplary embodiment of the disclosure, the lighting device further comprises at least one light-reflecting surface configured to reflect light emitted from the light-emitting element in a direction towards the light-emitting element. For example, a separate structure (e.g. a sheet of glass or metal) may at least partially be arranged in between the light-emitting surface of the light-emitting element and the light-guiding sheet, said structure comprising holes in correspondence with the at least one cavity. The at least one light-reflecting surface may in such example correspond to at least one reflective portion of the structure e.g. adjacent to such holes. Such reflective portion may be reflective by itself (the structure e.g. being formed from metal or glass) or may be provided with a reflective coating such that light emitted from the light-emitting element towards said reflective portion is reflected back towards the light-emitting element, e.g. towards its light-emitting surface.

In an alternative example, the light-emitting surface of the at least one light emitting element may correspond to a portion of a top surface of said at least one light emitting-element, whereby at least part of a remaining portion of said top surface may be reflective to form the light-reflecting surface. In this case, light not emitted from the light-emitting element via the light-emitting surface may at least partially be reflected back by said light-reflecting surface, back in a direction towards the light-emitting element.

Yet alternatively, the at least one light-reflecting surface may correspond to a portion of the light-guiding sheet. In other words, according to an exemplary embodiment, the light-guiding sheet comprises at least one light-reflecting surface adjacent to the at least one cavity and facing the at least one light-emitting surface. The light-reflecting surface may correspond to or be comprised by the portion of the light-guiding sheet covering (e.g. an edge portion) of the light-emitting surface. According to this exemplary embodiment, the light-reflecting surface is configured to reflect light emitted from the light-emitting surface in a direction towards the light-emitting surface.

For example, the light-guiding sheet may comprise or consist of glass, metal, ceramic, or silicone and may thus be configured to at least partially reflect light emitted from the light-emitting surface back in a direction towards the light-emitting surface. In order to further enhance reflectivity of the light-reflecting surface, according to an exemplary embodiment of the disclosure, the light-reflecting surface adjacent to the at least one cavity comprises a reflective coating. The coating may for example be a silver, an aluminum, or a dichroitic atomic layer deposition (ALD) coating. Light reflected back towards the light-emitting surface may again be reflected by the light-emitting surface to eventually exit the lighting device via the at least one cavity. The light-reflecting surface may thus help to reduce intensity losses at the edges of the light-emitting surface covered by the portions of the light-guiding sheet adjacent to the at least one cavity. In addition, while an effective area of the light-emitting surface is reduced by the opening of the cavity to enhance the collimating effect, the light-reflecting surfaces help to increase light intensity entering the cavity by redirecting light from edges of the light-emitting surface which otherwise may be lost. In exemplary embodiments, the mentioned coating provided at the light-reflecting surface may be a diffuse reflective coating.

According to an exemplary embodiment, the at least one light-emitting element may be mounted to a substrate, e.g. to a printed circuit board (PCB), and the light-guiding sheet may be fixed to the substrate using a suitable glue. For example, an outer portion of the light-guiding sheet may be glued to a corresponding portion of the substrate. In addition or alternatively, the light-guiding sheet may be fixed to the substrate using silicone, in particular transparent silicone, at least partially filled into the at least one cavity and being configured to adhere to a surface underneath the at least one cavity. Said surface may be the light-emitting surface of the at least one light-emitting element or the wavelength conversion layer arranged in between the light-guiding sheet and the at least one light-emitting element. Thus, according to an exemplary embodiment of the disclosure, the at least one cavity is at least partially filled with silicone, in particular with silicone transparent for light emitted by the light-emitting element, configured to adhere to at least one of the light-emitting surface or the wavelength conversion layer arranged on the light-emitting surface. Advantageously, as mentioned earlier herein, in exemplary embodiments, the opening of the at least one cavity facing away from the light-emitting surface may be larger as the opening of the at least one cavity facing the light-emitting element (the cavity e.g. being tapered towards the light-emitting surface). Such geometry of the at least one cavity supports the function of the adhesive silicone to fix the light-guiding sheet to the underlying surface. In this way, for example an array or a matrix of light-emitting elements may be conveniently assembled or pre-assembled with a light-guiding sheet having cavities corresponding to the array or matrix of light-emitting elements.

According to an exemplary embodiment of the disclosure, the at least one wavelength conversion layer is at least partially arranged in between at least a portion of the light-guiding sheet and at least a portion of the light-emitting surface. In exemplary embodiments of the present disclosure, said portion of the light-guiding sheet comprises or corresponds to the light-reflecting surface. Said portion of the light-guiding sheet thus reflects (at least part of the) light emitted from the light-emitting surface back into the wavelength conversion layer. Thus, light, which enters the at least one cavity after being reflected back from said portion of the light-guiding layer has an increased probability of being wavelength converted as a result of multiple (at least two) passages through the wavelength conversion layer. An intensity of wavelength converted light is thus increased at a center portion of the wavelength conversion layer underneath the at least one cavity.

While such increased intensity of wavelength converted light may be desirable for certain applications, according to an alternative exemplary embodiment of the disclosure, the at least one wavelength conversion layer may alternatively be arranged on the light-emitting surface and inside of the at least one cavity. In accordance with this alternative embodiment, the light-reflecting surface of the light-guiding sheet may be arranged in direct contact with a corresponding portion of the light-emitting surface of the light-emitting element.

As explained above, the at least one cavity being provided with at least one lateral surface configured to reflect light emitted from the light-emitting surface acts as collimator for light emitted from the light-emitting element. A light-guiding sheet having for example a plurality of cavities arranged in correspondence with positions of a plurality of light-emitting elements, such a LEDs of an ADB LED matrix, may form an advantageous collimating optical element allowing for a compact and robust construction with a collimating effect which may be adapted to the underlying light-emitting elements by shaping lateral surfaces limiting the respective cavities. In addition to an adjustment of a collimating effect, adjustment of shapes of the at least one lateral surface (e.g. angle with respect to an underlying light-emitting surface or curvature) may generate desired radiation patterns. Thus, according to an exemplary embodiment of the disclosure, the opening of the at least one cavity facing the light-emitting surface and the opening of the at least one cavity facing away from the light-emitting surface comprise different aspect ratios. Such different aspect ratios may correspond to different angles of pairs of lateral surfaces of a cavity with rectangular openings. Applying such differing geometries to said openings of the at least one cavity, asymmetrical radiation patterns may be created which may help to guide light e.g. for ADB applications in desirable directions.

As described above, with the at least one cavity of the light-guiding sheet acting as collimator for light emitted from the at least one light-emitting element, the lighting device according to embodiments of the disclosure provides for highly efficient light emission while in particular use of the light-guiding sheet enables a compact and robust system design.

The features and example embodiments of the disclosure described above may equally pertain to the different aspects according to the present disclosure. In particular, with the disclosure of features relating to the lighting device according to first aspect, also corresponding features relating to a method for producing a lighting device according to the second aspect and to the use according to the third aspect are disclosed.

It is to be understood that the presentation of embodiments of the disclosure in this section is merely exemplary and non-limiting.

Other features of the present disclosure will become apparent from the following detailed description considered in conjunction with the accompanying drawings. It is to be understood, however, that the drawings are designed solely for purposes of illustration and not as a definition of the limits of the disclosure, for which reference should be made to the appended claims. It should be further understood that the drawings are not drawn to scale and are merely intended to conceptually illustrate the structures and procedures described herein.

BRIEF DESCRIPTION OF THE DRAWINGS

Examples of the disclosure will now be described in detail with reference to the accompanying drawing, in which.

DETAILED DESCRIPTION OF THE EMBODIMENTS

Figure 1:
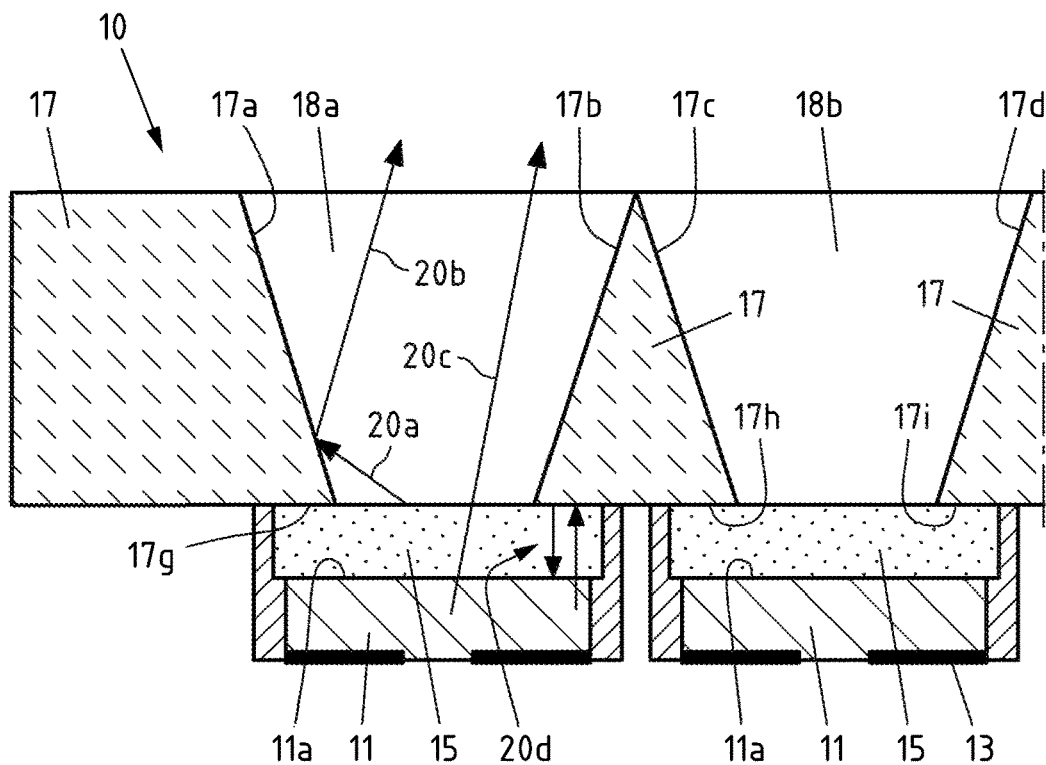
FIG. 1 shows a schematic representation of a first embodiment of a lighting device according to the disclosure.

FIG. 1 shows a cross-section of a first embodiment of a lighting device 10. The lighting device comprises two light-emitting diode (LED) dies 11 as examples of light-emitting elements in accordance with embodiments of the present disclosure. The LED dies 11 are electronically contacted via contacts 13 (only one contact labelled in the figure) e.g. of a printed circuit board (not shown) and comprise respective light-emitting surfaces 11a configured to emit light generated by the LED dies. A wavelength conversion layer 15 comprising Phosphor is provided on and in contact with each of the LED dies 11, respectively, to convert essentially blue light emitted from each LED die 11 into yellow light to be mixed with non-converted blue light for white light generation.

The lighting device 10 further comprises a light-guiding sheet 17 being arranged on the light-emitting surfaces 11a, partially covering the same with portions 17g, 17h and 17i. The light-guiding sheet 17 forms a layer of the lighting device 10 arranged on the light-emitting surfaces 11a of the LED dies 11 with no portions thereof being arranged in between LED dies 11. The light-guiding sheet 17 thus allows for a close arrangement of LED dies 11 and thereby facilitates a compact system design of lighting device 10.

FIG. 1 shows two cavities 18a, 18b of the light-guiding sheet 17. As can be taken from a top view of the lighting device 10 shown in FIG. 4 discussed below, the light-guiding sheet 17 has further cavities not shown in FIG. 1, the cavities forming a matrix arrangement for a corresponding matrix arrangement of LEDs. Referring back to FIG. 1, cavities 18a and 18b are open towards the light-emitting surface 11a and towards the opposing side and thus form respective passages for light emitted from said light-emitting surfaces 11a. For example, light ray 20c emitted from the light-emitting surface 11a passes through cavity 18a along a direct path.

Cavities 18a and 18b are limited by lateral surfaces 17a, 17b, 17c, 17d, respectively. The lateral surfaces are configured to reflect light emitted from each respective LED die 11 and/or from each respective wavelength conversion layer 15. For example, light ray 20a emitted from the wavelength conversion layer 15 to the left in the figure is reflected from lateral surface 17a as light ray 20b in a direction towards a normal on the light-emitting surface 11a. Thus, lateral surfaces 17a, 17b, 17c and 17d collimate light emitted from LED dies 11 and/or from wavelength conversion layers 15. Thereby, a collimating effect of cavities 18a, 18b is supported by providing respective entrance openings thereof smaller than the light-emitting surfaces 11a (light from a smaller light source can be generally better collimated). Lateral surfaces 17a, 17b, 17c, 17d, may be coated with a reflective coating e.g. of silver, aluminum or a dichroitic Atomic Layer Deposition (ALD) to further enhance reflectivity. As further shown in FIG. 1, cavities 18a, 18b are tapered towards the light-emitting surfaces 11a. As a result, a width of a bridge portion bridging the adjacent cavities 18a, 18b is minimized thus optically bridging said cavities.

FIG. 1 further shows light-reflecting surfaces 17g, 17h and 17i, which are adjacent to cavities 18a, 18b and which face the respective light-emitting surfaces. As exemplarily shown, the light-reflecting surfaces reflect light emitted at edge portions of the light-emitting surface 11a back (see e.g. light rays 20d). As part of the light reflected by light-reflecting surfaces 17g, 17h and 17i is reflected towards the center portion of the wavelength conversion layers 15, the light-reflecting surfaces 17g, 17h and 17i help to concentrate and enhance light intensity underneath the entrance openings of cavities 18a, 18b and thus help to at least partially compensate for an intensity loss due to a size reduction of the cavity entrance openings. As in case of lateral surfaces 17a, 17b, 17c and 17d, a reflective coating e.g. of silver, aluminum or a dichroitic Atomic Layer Deposition (ALD) coating may be provided on light-reflecting surfaces 17g, 17h and 17i to enhance reflectivity.

Figure 2:
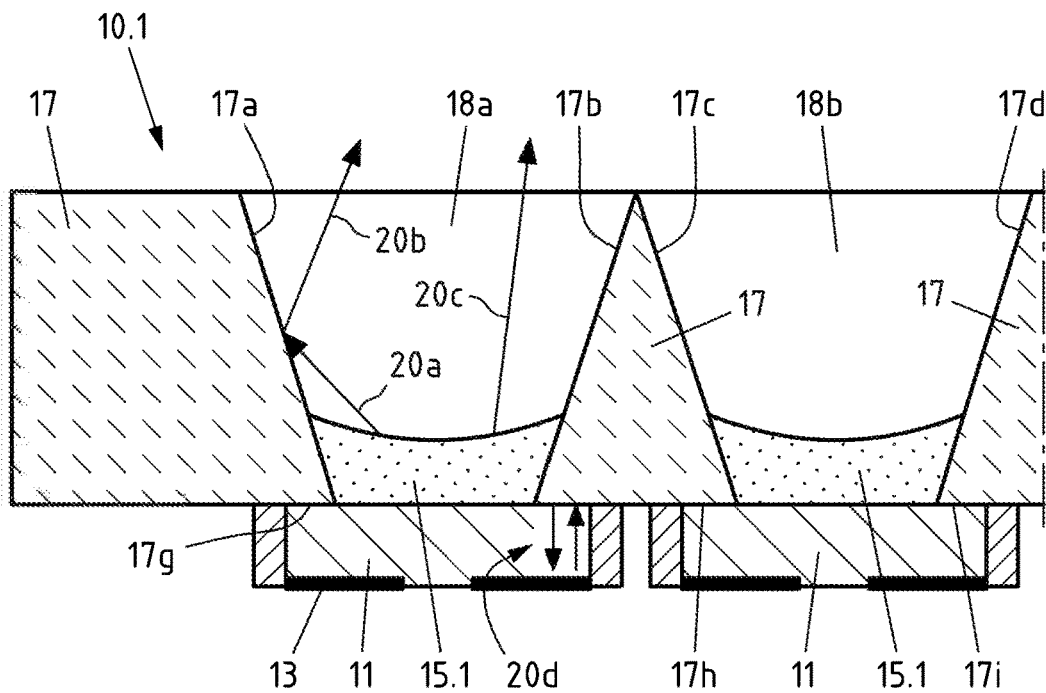
FIG. 2 shows a schematic representation of a second embodiment of a lighting device according to the disclosure.

FIG. 2 shows a second embodiment of a lighting device 10.1 according to the disclosure where parts corresponding to those of the first embodiment of FIG. 1 are labeled as in FIG. 1. As compared to the first embodiment of FIG. 1, the lighting device 10.1 comprises wavelength conversion layers 15.1a, 15.1b arranged on the respective light-emitting surfaces 11a and inside of the respective cavities 18a, 18b.

Figure 3:
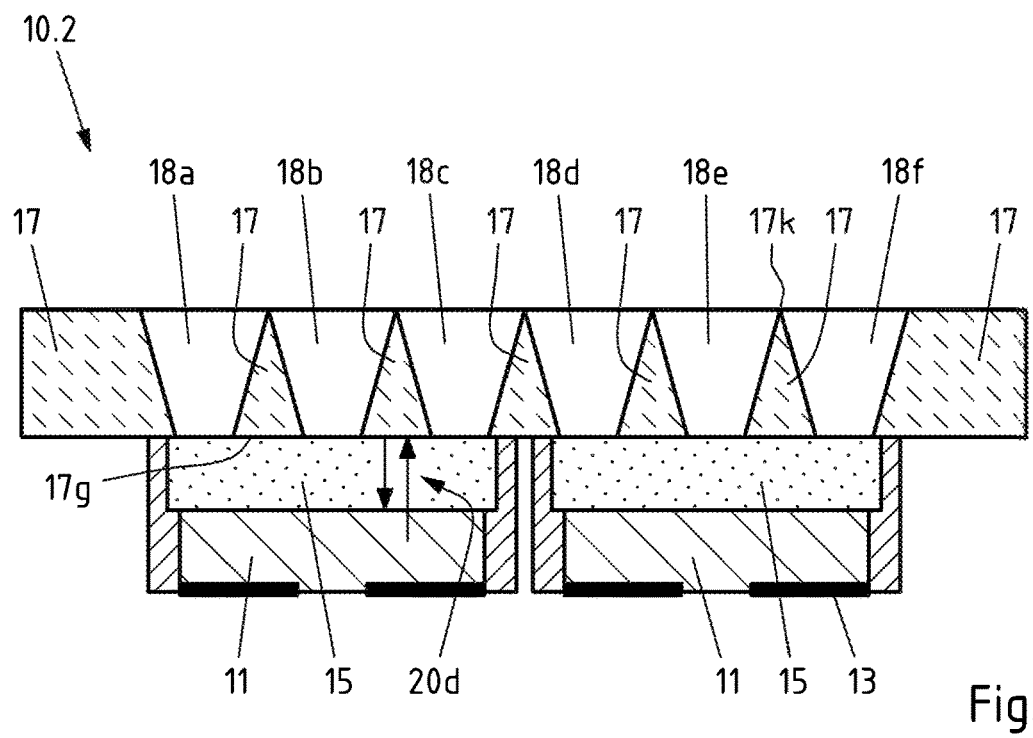
FIG. 3 shows a schematic representation of a third embodiment of a lighting device according to the disclosure.

FIG. 3 shows a third exemplary embodiment of a lighting device 10.2 according to the disclosure according to which the light-guiding sheet 17 comprises at least two cavities corresponding to the at least one light-emitting element 1. In other words, in accordance with this exemplary embodiment, the lighting device may comprise more than one light emitting element 1 and at least two cavities are provided per light-emitting element 1. In the example case of FIG. 3, three cavities 18a, 18b, and 18c correspond to the light-emitting element 11 to the left in the figure while three cavities 18d, 18e and 18f correspond to the emitting element 11 to the right in the figure. These six cavities form respective passages for light emitted from respective light-emitting surfaces of light-emitting elements 11. The embodiment of FIG. 3 thus further miniaturizes the collimating cavities to enable use of multiple smaller cavities per LED die. In this way, a lower reflector height (height of the lateral surfaces) and smaller bridge portions 17k (only one labelled) can be achieved to further increase light output intensity and to further optically bridge optical gaps between cavities (pixel gaps). An increased area of the light-guiding sheet 17 overlaying the LED dies 11 (only light-reflecting surface 17g being explicitly labelled) can be compensated for by providing portions of the light-guiding sheet 17 overlaying the LED dies with a reflective coating (e.g. a silver, aluminum of dichroitic ALD coating). Light from the LED dies 11 may thus be reflected (e.g. reflected rays 20d) by the corresponding light-reflecting surfaces 17g as described in case of light-reflecting surfaces 17g, 17h and 17i of FIG. 1 to concentrate light at entrance openings of cavities 18a, 18b, 18c, 18d, 18e and 18f and to enhance an intensity of converted light at these openings.

Figure 4:
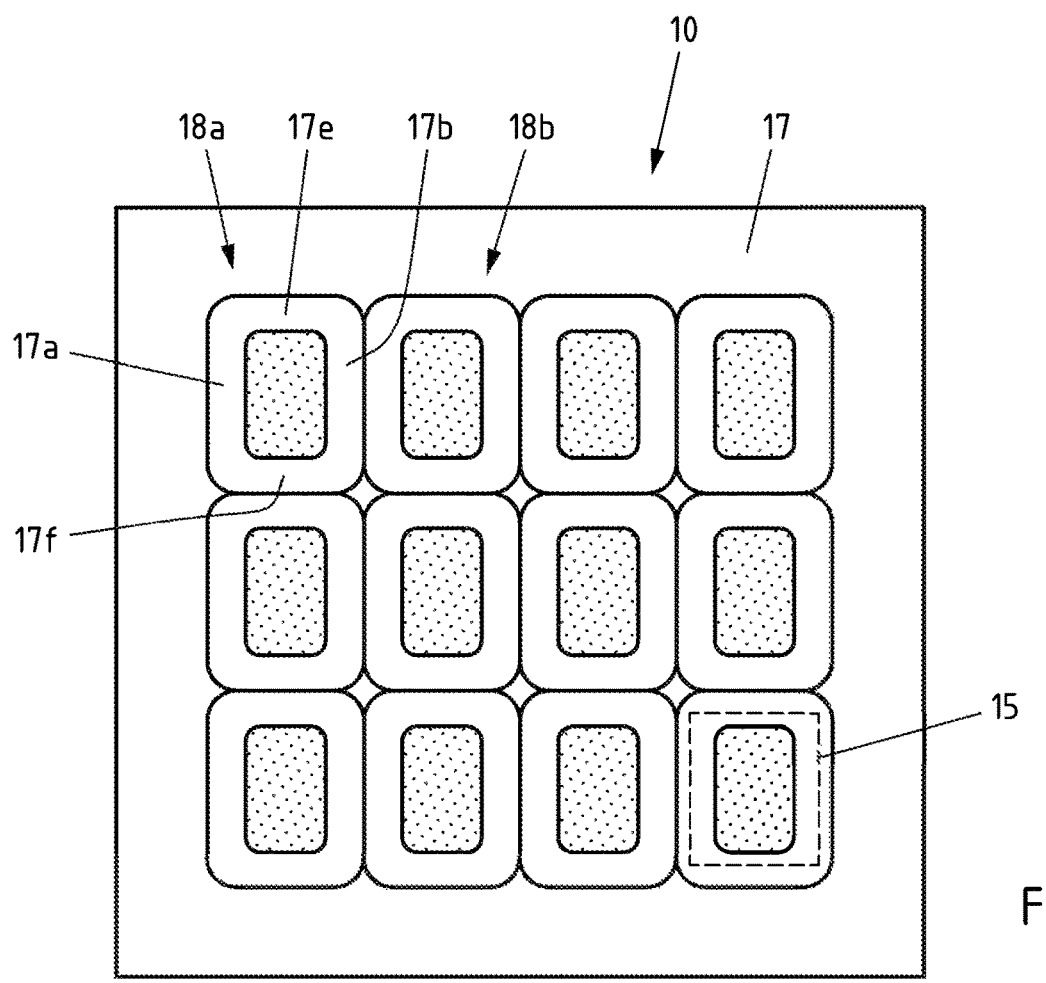
FIG. 4 shows a top view of the embodiment of FIG. 1.

FIG. 4 shows a top view of the lighting device 10 of FIG. 1 where the left two cavities 18a, 18b in the top row of the figure correspond to cavities 18a, 18b of FIG. 1. Further cavities are not labeled for conciseness of the figure. As shown, lighting device 10 includes a matrix of 12 cavities arranged on corresponding LED dies (not shown) forming an LED matrix, e.g. for an ADB application. FIG. 4 illustrates cavity 18a having a rectangular cross section with the mutually opposing lateral surfaces 17a and 17b (corresponding to lateral surfaces 17a and 17b of FIG. 1) being wider than the mutually opposing lateral surfaces 17e and 17f). The dashed rectangle drawn over the rightmost cavity in the third row of FIG. 4 illustrates an extension of wavelength conversion layer 15 which (similarly for the further cavities of FIG. 4) extends underneath the lateral surfaces.

Figure 5:
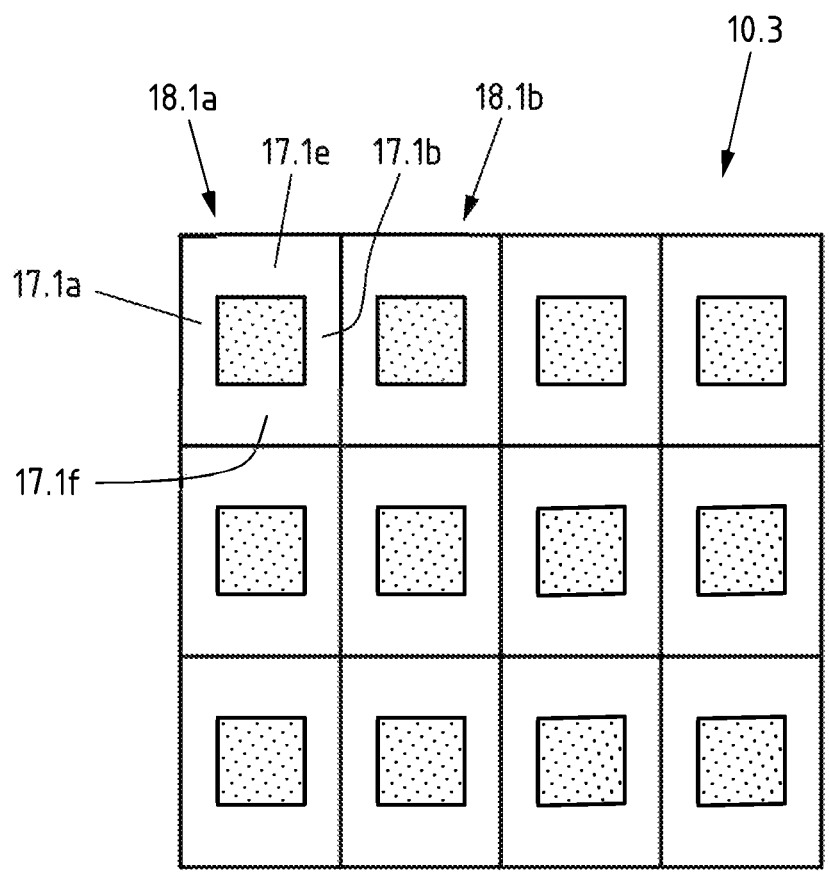
FIG. 5 shows a schematic representation of a fourth embodiment of a lighting device according to the disclosure.

FIG. 5 shows a top view of a fourth embodiment of a lighting device 10.3. In this embodiment, an angle formed by each of the mutually opposing surfaces 17.1e and 17.1f with an underlying light-emitting surface of a respective LED (not shown in the figure) is larger as an angle formed by each of the mutually opposing surfaces 17.1a and 17.1b. As a result, a rectangular cross-section of the opening of the cavity 18.1a facing the light-emitting surface (inner rectangle of cavity 18.1a in FIG. 5) has an aspect ratio different from an aspect ratio of the opening of the cavity 18.1a facing away from the light-emitting surface (outer rectangle of cavity 18.1a in FIG. 5). As explained above, by adjusting such different aspect ratios, asymmetrical radiation patterns e.g. of an ADB lighting matrix may be created.

Figure 6:
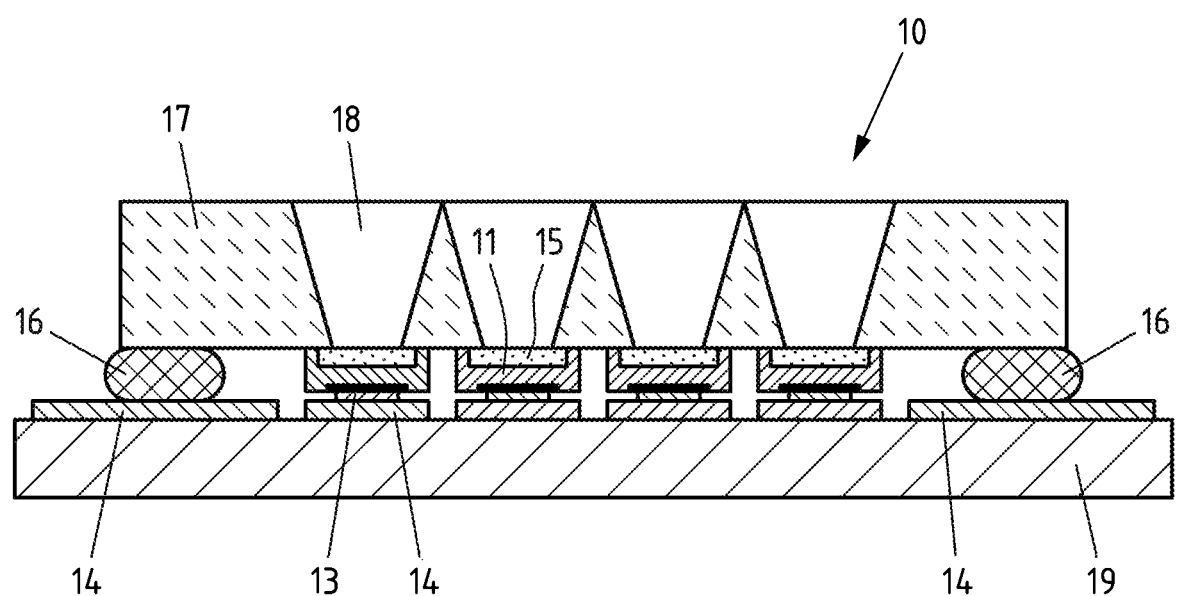
FIG. 6 shows a cross-section of the embodiment of FIG. 4.
Figure 7:
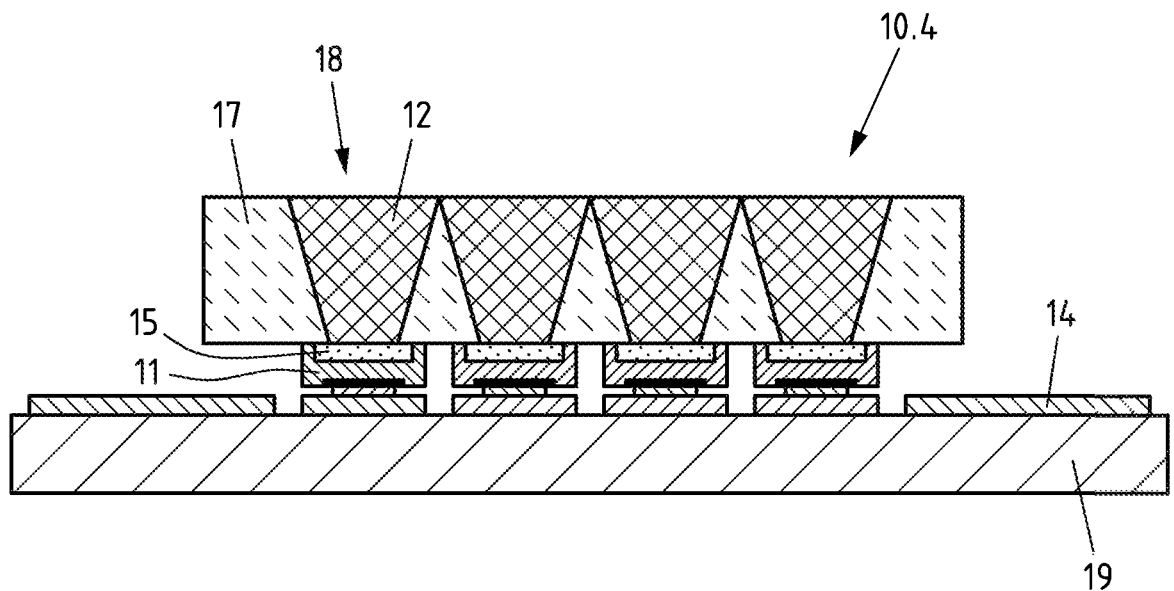
FIG. 7 shows a schematic representation of a fifth embodiment of a lighting device according to the disclosure.
Figure 8:
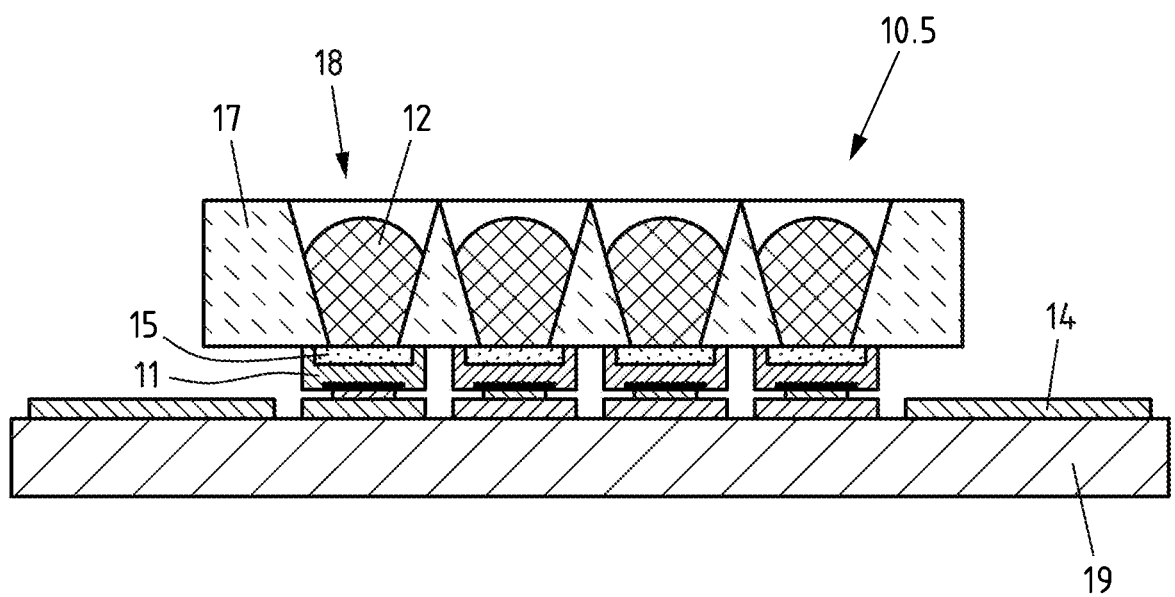
FIG. 8 shows a schematic representation of a sixth embodiment of a lighting device according to the disclosure.

FIG. 6 shows a side view of the lighting device 10 of FIGS. 1 and 4 in more detail. As shown, the light-guiding sheet 17 forms a layer of the lighting device 10 arranged (indirectly) on light-emitting surfaces 11a of LED dies 11. The light-guiding sheet 17 is attached to a substrate 19 via glue portion 16. In the shown case of FIG. 6, the light-guiding sheet 17 is glued to contact layer 14 which includes electronic contacts for controlling the LED dies 11. In an alternative embodiment of the lighting device 10.4 illustrated in FIG. 7, the light-guiding sheet 17 is attached to the LED dies 11 by filling the cavities 18 with silicone transparent for light emitted from LED dies 11 and configured to adhere to the underlying surface, in particular to the wavelength conversion layer 15 shown in FIG. 7. Such alternative embodiment may allow for a homogeneous attachment of the light-guiding sheet 17 to the underlying structure which may e.g. help to prevent internal stress of the structures. Further, due to the refractive index of the silicone filling 12, by directly contacting the wavelength conversion layer 15, the silicone filling 12 supports extraction of a higher light intensity. In other words, the silicone filling 12 helps to guide more light into a desired direction. While radiation leaving the guiding silicon fill 12 may again be divergent, this effect may be compensated for by only partly filling the cavities 18 as shown in FIG. 8 illustrating a further exemplary embodiment of lighting device 10.5. In the case of FIG. 8, diverging light emitted from silicon fill 12 is collimated by a lateral surface limiting the only partly filled cavity 18 (by the part not covered by silicone filling 12).

Figure 9:
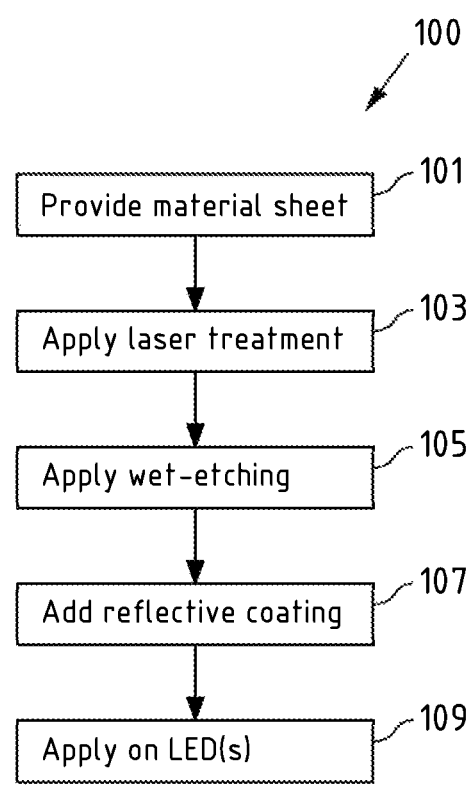
FIG. 9 shows an exemplary embodiment of a method for producing a lighting device according to the disclosure.

FIG. 9 illustrates exemplary method 100 for producing a lighting device 10. In step 101 a sheet of material, e.g. a glass sheet is provided. Further suitable materials include e.g. ceramic, silicone and metal. The sheet is subjected to a laser treatment in step 103, e.g. using a pulsed laser beam, to locally modify the material to be susceptible to a subsequent wet-etching treatment. The laser treatment can thus be applied to "write" the at least one cavity into the material sheet with high precision. In step 105, the treated material sheet is subjected to the wet-etching treatment, e.g. by immersing the treated sheet into an acid bath, e.g. into hydrofluoric acid, which removes the laser-treated portions. In step 107, a reflective coating is applied to lateral surfaces limiting the cavities and to surfaces adjacent to the cavities, which will be surfaces facing the at least one light-emitting element when the material sheet is used as light-guiding sheet in a lighting device. In step 109, the sheet of material including the cavities, i.e. the light-guiding sheet is mounted to the at least one light-emitting element, e.g. to a matrix arrangement of LEDs, e.g. either using glue 16 as illustrated in FIG. 6 or using adhesive silicone filled into cavities as illustrated in FIGS. 7 and 8.

The invention claimed is:

1. A lighting device comprising:
   at least one light-emitting element comprising a light-emitting surface configured to emit light;
   a light-guiding sheet on and at least partially covering the light-emitting surface and comprising at least one cavity forming a passage for light emitted from the light-emitting surface, the at least one cavity comprising at least one lateral surface configured to reflect light emitted from the light-emitting surface, and
   a size of an opening of the at least one cavity facing the light-emitting surface being smaller than an area of the light-emitting surface; and
   at least one light-reflecting surface that is one of: arranged between the light-emitting surface of the at least one light-emitting element and the light-guiding sheet, corresponds to a portion of a top surface of the at least one light-emitting element, or corresponds to a portion of the light-guiding sheet facing the light-emitting surface of the at least one light-emitting element, the at least one light-reflecting surface being configured to reflect light emitted from the at least one light-emitting element in a direction towards the at least one light-emitting element.

2. The lighting device according to claim 1, wherein the opening of the at least one cavity facing the light-emitting surface is smaller than an opening of the at least one cavity facing away from the light-emitting surface.

3. The lighting device according to claim 1, wherein the at least one cavity is tapered in a direction towards the at least one light-emitting element.

4. The lighting device according to claim 1, wherein the at least one lateral surface of the at least one cavity comprises a reflective coating.

5. The lighting device according to claim 1, wherein the light-guiding sheet comprises or consists of glass, ceramic, silicone or metal.

6. The lighting device according to claim 1, wherein the lighting device further comprises at least one wavelength conversion layer at least partially between at least a portion of the light-guiding sheet and at least a portion of the light-emitting surface.

7. The lighting device according to claim 1, wherein the lighting device further comprises at least one wavelength conversion layer on the light-emitting surface and inside of the at least one cavity.

8. The lighting device according to claim 1, wherein the at least one cavity is at least partially filled with a silicone configured to adhere to at least one of the light-emitting surface or the wavelength conversion layer arranged on the light-emitting surface.

9. The lighting device according to claim 1, wherein the opening of the at least one cavity facing the light-emitting surface and an opening of the at least one cavity facing away from the light-emitting surface comprise different aspect ratios.

10. The lighting device according to claim 1, wherein the light-guiding sheet comprises at least two cavities corresponding to the at least one light-emitting element forming respective passages for light emitted from the light-emitting surface of said at least one light-emitting element.

11. The lighting device according to claim 1, wherein the at least one light-emitting element is a light-emitting diode on a printed circuit board.

12. Use of a lighting device according to claim 1 for automotive lighting, in particular for automotive head lighting.

13. The lighting device according to claim 1, wherein the light-reflecting surface comprises a reflective coating.

14. A method for producing a lighting device, the method comprising:
    providing at least one light-emitting element comprising a light-emitting surface configured to emit light;
    providing a light-guiding sheet to be arranged on and at least partially cover the light-emitting surface;
    forming at least one cavity in the light-guiding sheet to provide a passage for light emitted from the light-emitting surface, the at least one cavity being formed to have a size of an opening facing the light-emitting surface smaller than an area of the light-emitting surface and to have at least one lateral surface configured to reflect light emitted from the light-emitting surface in a direction towards the at least one light-emitting element; and
    forming at least one light-reflecting surface to one of: be arranged in between the light-emitting surface of the at least one light-emitting element and the light-guiding sheet, correspond to a portion of a top surface of the at least one light-emitting element, or correspond to a portion of the light-guiding sheet facing the light-emitting surface of the at least one light-emitting element.

15. The method according to claim 14, wherein the forming the at least one cavity further comprises applying a laser treatment to a portion of a material sheet.

16. The method according to claim 15, further comprising applying an etching process at least to the portion of the material sheet to form the at least one cavity.

17. The method of claim 15, wherein the portion of the material sheet comprises at least one of glass, ceramic, silicone or metal.

* * * * *